US010868420B2

(12) United States Patent
Huang

(10) Patent No.: US 10,868,420 B2
(45) Date of Patent: Dec. 15, 2020

(54) INPUT PROTECTION CIRCUIT

(71) Applicant: PEGATRON CORPORATION, Taipei (TW)

(72) Inventor: Chien-Chih Huang, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 167 days.

(21) Appl. No.: 16/182,631

(22) Filed: Nov. 7, 2018

(65) Prior Publication Data
US 2019/0165569 A1 May 30, 2019

(30) Foreign Application Priority Data

Nov. 24, 2017 (TW) .............................. 106141016 A

(51) Int. Cl.
| | | |
|---|---|---|
| *H02H 9/08* | (2006.01) | |
| *H02H 9/00* | (2006.01) | |
| *G01R 19/165* | (2006.01) | |
| *H02H 1/00* | (2006.01) | |
| *H02H 3/20* | (2006.01) | |
| *H02H 3/08* | (2006.01) | |

(52) U.S. Cl.
CPC ....... *H02H 9/008* (2013.01); *G01R 19/16571* (2013.01); *G01R 19/16576* (2013.01); *H02H 1/0007* (2013.01); *H02H 3/08* (2013.01); *H02H 3/20* (2013.01)

(58) Field of Classification Search
CPC ........ H02H 9/008; H02H 1/0007; H02H 3/08; H02H 3/20; H02H 9/00; H02H 9/02; H02H 9/04; G01R 19/16571; G01R 19/16576
See application file for complete search history.

(56) References Cited

U.S. PATENT DOCUMENTS

| | | | |
|---|---|---|---|
| 6,140,928 A * | 10/2000 | Shibuya | ............. G01R 31/3842 340/636.13 |
| 7,394,223 B2 | 7/2008 | Lai et al. | |
| 8,232,772 B2 | 7/2012 | Lai et al. | |

(Continued)

FOREIGN PATENT DOCUMENTS

| | | |
|---|---|---|
| CN | 101499643 B | 2/2011 |
| CN | 105322507 A | 2/2016 |
| TW | I446667 B | 7/2014 |

*Primary Examiner* — Adolf D Berhane
(74) *Attorney, Agent, or Firm* — McClure, Qualey & Rodack, LLP

(57) ABSTRACT

An input protection circuit includes a current detection circuit, a voltage detection circuit, a latch circuit and an output circuit. The current detection circuit receives a power input, and when an input current exceeds a threshold current, the current detection circuit outputs a control current. The voltage detection circuit is coupled to the current detection circuit, and when the input voltage exceeds a threshold voltage, the voltage detection circuit outputs a control voltage. The latch circuit is coupled to the current detection circuit and the voltage detection circuit. When the latch circuit receives the control voltage or the control current, a switching voltage outputted by the latch circuit is equal to a reference voltage. The output circuit is coupled to the current detection circuit, the voltage detection circuit and the latch circuit. When the switching voltage is equal to the reference voltage, the output circuit stops outputting a power output.

10 Claims, 5 Drawing Sheets

(56) References Cited

U.S. PATENT DOCUMENTS

2016/0344209 A1\* 11/2016 Zhang ................ H02J 7/00036
2019/0013664 A1\* 1/2019 Yasunori .............. H02H 1/0007
2019/0181634 A1\* 6/2019 Saji ...................... H02H 1/0007

\* cited by examiner

INPUT PROTECTION CIRCUIT

CROSS-REFERENCE TO RELATED APPLICATION

This application claims priority to Taiwan Application Serial Number 106141016, filed Nov. 24, 2017, which is herein incorporated by reference in its entirety.

BACKGROUND OF THE INVENTION

Field of Invention

The disclosure relates to a protection circuit and, in particular, to an input protection circuit that can provide overvoltage protection and overcurrent protection.

Related Art

In order to avoid damage to electronic devices, today's electronic devices are generally provided with an overpower protection circuit or an overvoltage protection circuit at a power input terminal. However, the overpower protection circuits and overvoltage protection circuits today are too complicated and do not meet the trend of miniaturization of electronic devices.

SUMMARY OF THE INVENTION

An input protection circuit includes a current detection circuit, a voltage detection circuit, a latch circuit and an output circuit. The current detection circuit is configured to receive a power input, and when the input current exceeds a threshold current, the current detection circuit outputs a control current. The voltage detection circuit is coupled to the current detection circuit, and when the input voltage exceeds a threshold voltage, the voltage detection circuit outputs a control voltage. The latch circuit is coupled to the current detection circuit and the voltage detection circuit, and when the latch circuit receives the control voltage or the control current, a switching voltage outputted by the latch circuit is equal to a reference voltage. The output circuit is coupled to the current detection circuit, the voltage detection circuit and the latch circuit, and when the switching voltage is equal to the reference voltage, the output circuit stops outputting a power output.

BRIEF DESCRIPTION OF THE DRAWINGS

The present disclosure can be more fully understood by reading the following detailed description of the embodiment, with reference made to the accompanying drawings as follows.

DETAILED DESCRIPTION OF THE EMBODIMENT

The present disclosure will be apparent from the following detailed description, which proceeds with reference to the accompanying drawings, wherein the same references relate to the same elements.

Figure 1:
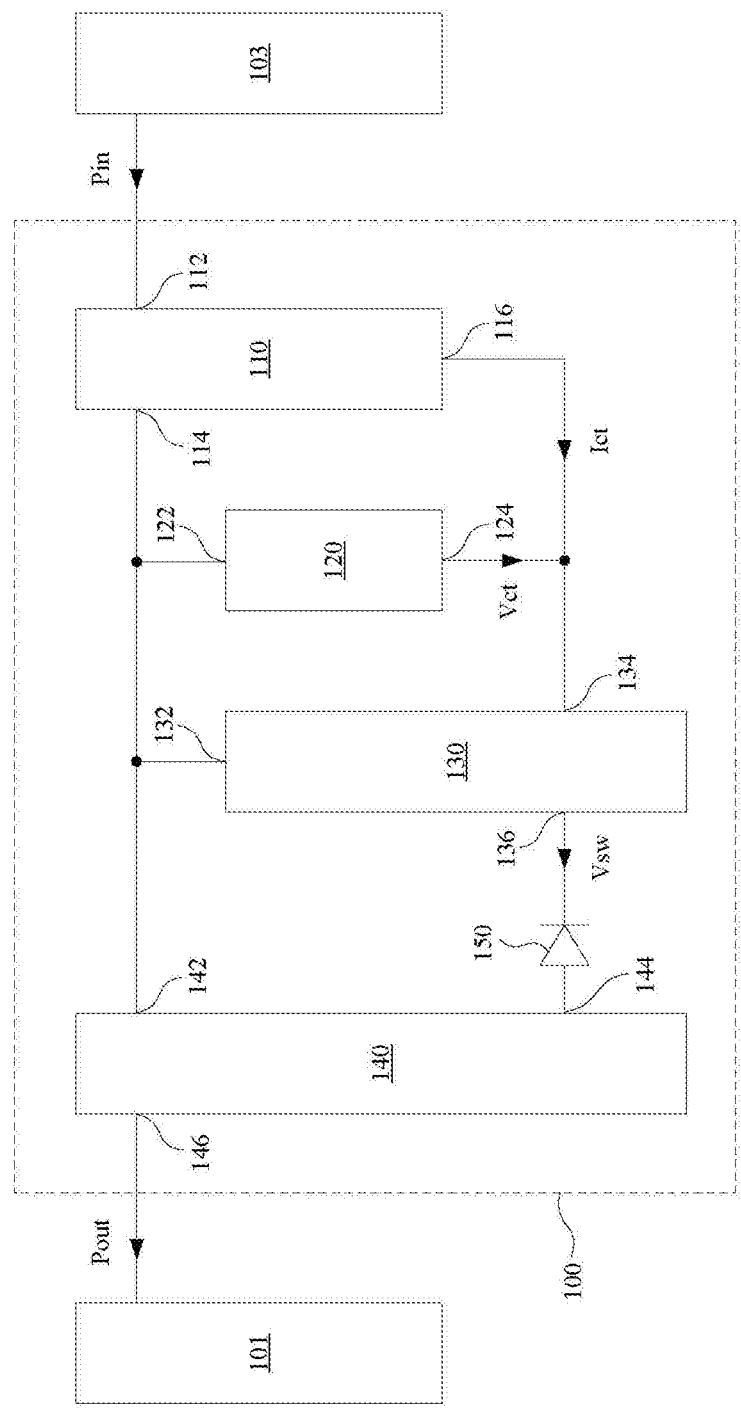
FIG. 1 is a simplified functional block diagram illustrating an input protection circuit according to one embodiment of the disclosure.

FIG. 1 is a simplified functional block diagram illustrating an input protection circuit 100 according to one embodiment of the disclosure. As shown in FIG. 1, the input protection circuit 100 includes a current detection circuit 110, a voltage detection circuit 120, a latch circuit 130, an output circuit 140 and a diode 150. The input protection circuit 100 can output a power output Pout according to a power input Pin provided by the power circuit 103, and the input protection circuit 100 can provide overvoltage protection (OVP) and overcurrent protection (OCP) to the backend circuit 101. For concise purpose, other elements and connections in the input protection circuit 100 are not depicted in FIG. 1.

The current detection circuit 110 includes an input terminal 112, a first output terminal 114 and a second output terminal 116. The current detection circuit 110 uses the input terminal 112 to receive the power input Pin. After the current detection circuit 110 receives the power input Pin, the current detection circuit 110 detects an input current of the power input Pin first to check whether it exceeds a threshold current, and then output the power input Pin via the first output terminal 114.

Specifically speaking, when the input current of the power input Pin exceeds a threshold current, the current detection circuit 110 uses the second output terminal 116 to output a control current Ict.

The voltage detection circuit 120 includes an input terminal 122 and an output terminal 124, and the input terminal 122 of the voltage detection circuit 120 is coupled to the first output terminal 114 of the current detection circuit 110. The voltage detection circuit 120 uses the input terminal 122 to receive an input voltage of the power input Pin from the current detection circuit 110 to detect whether the input voltage of the power input Pin exceeds a threshold voltage.

Specifically speaking, when the input voltage of the power input Pin exceeds the threshold voltage, the voltage detection circuit 120 uses the output terminal 124 to output a control voltage Vct.

The latch circuit 130 includes an input terminal 132, a control terminal 134 and an output terminal 136. The input terminal 132 of the latch circuit 130 is coupled to the first output terminal 114 of the current detection circuit 110 to receive the power input Pin from the current detection circuit 110. The control terminal 134 of the latch circuit 130 is coupled to the second output terminal 116 of the current detection circuit 110 and the output terminal 124 of the voltage detection circuit 120 to receive the control voltage Vct and the control current Ict. The latch circuit 130 outputs a switching voltage Vsw from the output terminal 136 according to the received control voltage Vct and the received control current Ict.

Specifically speaking, when the latch circuit 130 receives the control voltage Vct or the content current Ict, the latch circuit 130 maintains the switching voltage Vsw at a reference voltage. In this situation, the latch circuit 130 determines whether the input voltage of the power input Pin is lower than a disabling voltage or whether the input current is smaller than a disabling current. If yes, the switching voltage Vsw outputted by the latch circuit 130 is not equal to the reference voltage.

The output circuit 140 includes an input terminal 142, a control terminal 144 and an output terminal 146. The input terminal 142 of the output circuit 140 is coupled to the first output terminal 114 of the current detection circuit 110. The control terminal 144 of the output circuit 140 is coupled to the output terminal 136 of the latch circuit 130 via the diode 150. In detail, the cathode of the diode 150 is coupled to the output terminal 136 of the latch circuit 130, and the anode of the diode 150 is coupled to the control terminal 144 of the output circuit 140. The output circuit 140 uses the input terminal 142 to receive the power input Pin from the current detection circuit 110, and uses the control terminal 144 to receive the switching voltage Vsw from the latch circuit 130. The output circuit 140 further outputs a power output Pout from the output terminal 146 according to the received power input Pin. When the switching voltage Vsw is equal to the reference voltage, the output circuit 140 stops outputting the power output Pout.

Specifically speaking, when the input voltage of the power input Pin is lower than the threshold voltage, and the input current of the power input Pin is smaller than the threshold current, the switching voltage Vsw outputted by the latch circuit 130 will not be transmitted to the output circuit 140 via the diode 150. Therefore, the output circuit 140 outputs the power output Pout according to the power input Pin.

On the other hand, when the input voltage of the power input Pin is higher than the threshold voltage, or when the input current is larger than the threshold current, the switching voltage Vsw outputted by the latch circuit 130 is equal to the reference voltage and the switching voltage Vsw can be transmitted to the output circuit 140 via the diode 150. Therefore, the output circuit 140 will not output the power output Pout.

From the above, when the input voltage of the power input Pin is higher than the threshold voltage, the input protection circuit 100 provides the overvoltage protection. When the input current of the power input Pin is larger than the threshold current, the input protection circuit 100 provides the overcurrent protection.

Figure 2:
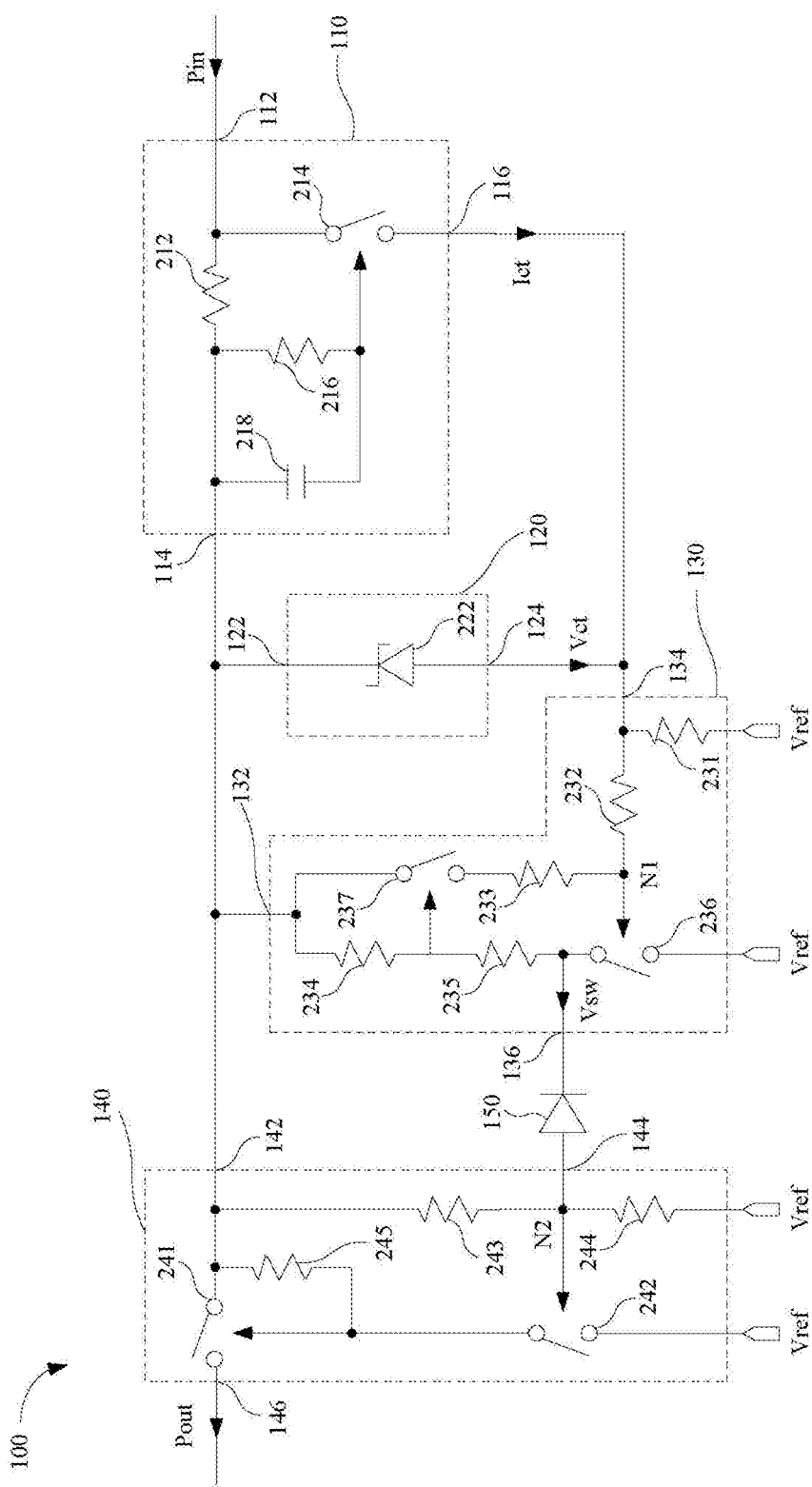
FIG. 2 is a schematic diagram illustrating circuit architecture of one embodiment of the input protection circuit shown in FIG. 1.

FIG. 2 is a schematic diagram illustrating the circuit architecture of one embodiment of the input protection circuit 100 shown in FIG. 1. As shown in FIG. 2, the current detection circuit 110 includes an input terminal 112, a first output terminal 114, a second output terminal 116, a detection resistor 212, a shunt switch 214, a voltage-regulating resistor 216 and a voltage-regulating capacitor 218. The detection resistor 212 is coupled between the input terminal 112 and the first output terminal 114. The shunt switch 214 is coupled between the input terminal 112 and the second output terminal 116. The voltage-regulating resistor 216 is coupled between the first output terminal 114 and a control terminal of the shunt switch 214. The voltage-regulating capacitor 218 is coupled between the first output terminal 114 and the control terminal of the shunt switch 214.

In the present embodiment, the shunt switch 214 is set to be turned on when its control terminal receives a low voltage. In practical, the shunt switch 214 may be realized by a PNP bipolar transistor or a P-type MOSFET.

The voltage detection circuit 120 includes an input terminal 122, an output terminal 124 and a Zener diode 222. The cathode of the Zener diode 222 is coupled to the input terminal 122 of the voltage detection circuit 120, and the anode of the Zener diode 222 is coupled to the output terminal 124 of the voltage detection circuit 120.

The latch circuit 130 includes an input terminal 132, a control terminal 134, and an output terminal 136, a first resistor 231, a second resistor 232, a third resistor 233, a fourth resistor 234, a fifth resistor 235, a first switch 236 and a second switch 237. The first terminal of the first resistor 231 is coupled to the control terminal 134 of the latch circuit 130, and the second terminal of the first resistor 231 is coupled to a reference voltage Vref. The first terminal of the second resistor 232 is coupled to control terminal 134 of the latch circuit 130. The first terminal of the first switch 236 is coupled to the output terminal 136 of the latch circuit 130. The control terminal (i.e., the first node N1) of the first switch 236 is coupled to the second terminal of the second resistor 232, and the second terminal of the first switch 236 is coupled to the reference voltage Vref. The first terminal of the second switch 237 is coupled to the input terminal 132 of the latch circuit 130. The third resistor 233 is coupled between the second terminal of the second switch 237 and the second terminal of the second resistor 232. The fourth resistor 234 is coupled between the input terminal 132 of the latch circuit 130 and the control terminal of the second switch 237. The fifth resistor 235 is coupled between the control terminal of the second switch 237 and the output terminal 136 of the latch circuit 130.

In the present embodiment, the first switch 236 is set to be turned on when its control terminal receives a high voltage, and the second switch 237 is set to be turned on when its control terminal receives a low voltage. In practical applications, the first switch 236 may be realized by an NPN bipolar transistor or an N-type MOSFET. The second switch 237 may be realized by a PNP bipolar transistor or a P-type MOSFET.

The output circuit 140 includes an input terminal 142, a control terminal 144, an output terminal 146, an output switch 241, a control switch 242, a first voltage divider resistor 243, a second voltage divider resistor 244, and a third voltage divider resistor 245. The output switch 241 is coupled between the input terminal 142 and the output terminal 146 of the output circuit 140. The control switch 242 is coupled between the control terminal of the output switch 241 and the reference voltage Vref, and the control terminal (i.e., the second node N2) of the control switch 242 is coupled to the control terminal 144 of the output circuit 140. The first voltage divider resistor 243 is coupled between the input terminal 142 of the output circuit 140 and the control terminal 144 of the output circuit 140. The second voltage divider resistor 244 is coupled between the control terminal 144 of the output circuit 140 and the reference voltage Vref. The third voltage divider resistor 245 is coupled between the input terminal 142 of the output circuit 140 and the control terminal of the output switch 241.

The anode of the diode 150 is coupled to the control terminal 144 of the output circuit 140, and the cathode of the diode 150 is coupled to the output terminal 136 of the latch circuit 130.

The operations, coupling relationships and advantages of the functional blocks shown in FIG. 1 are similar to those shown in FIG. 2. Therefore, repetitive details are omitted here for concise purpose.

Figure 3A:
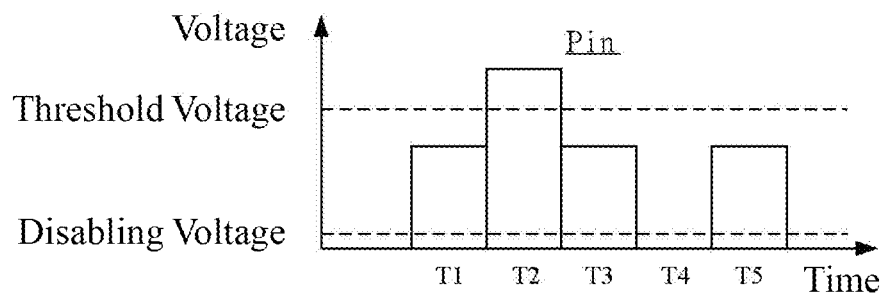
FIG. 3A shows timing variations of an input voltage of a power input received by the input protection circuit.
Figure 3B:
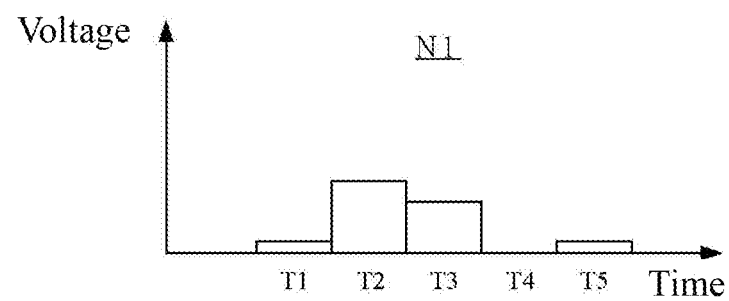
FIG. 3B shows the timing variations of the voltage of a first node of a latch circuit.
Figure 3C:
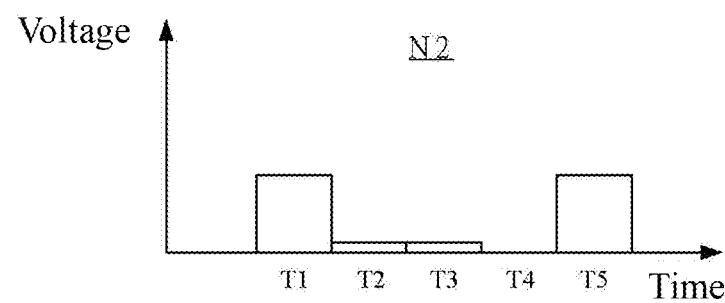
FIG. 3C shows the timing variations of the voltage of a second node of the output circuit.
Figure 3D:
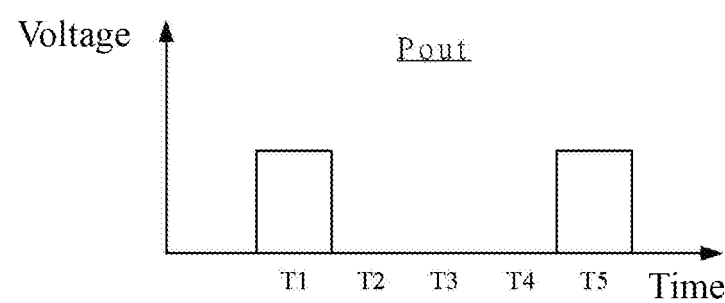
FIG. 3D shows the timing variations of a power output outputted by the output circuit.

The operations of the input protection circuit 100 of FIG. 2 will be further described with reference to FIGS. 3A-3D and FIGS. 4A-4D. Referring to FIGS. 3A-3D, wherein FIG. 3A shows the timing variations of the input voltage of the power input Pin received by the input protection circuit 100, FIG. 3B shows the timing variations of the voltage of the first node N1 of the latch circuit 130, FIG. 3C shows the timing variations of the voltage of the second node N2 of the output circuit 140, and FIG. 3D shows the timing variations of the power output Pout outputted by the output circuit 140.

Referring to FIG. 2 and FIGS. 3A-3D simultaneously. In the first time slot T1, the input voltage of the power input Pin does not exceed the threshold voltage, and the input current of the power input Pin does not exceed the threshold current, either. Under such situation, the shunt switch 214 of the current detection circuit 110 is in an off state, and the Zener diode 220 of the voltage detection circuit 120 is in a reverse bias state. Therefore, in the first time slot T1, the current detection circuit 110 does not output the control current Ict from its second output terminal 116, and the voltage detection circuit 120 does not output the control voltage Vct from its output terminal 124.

That is, in the first time slot T1, the control terminal 134 of the latch circuit 130 will not receive the control voltage Vct and the control current Ict. Therefore, the voltage at the first node N1 is the reference voltage Vref at the low voltage level, which makes the first switch 236 be in an off state. Under such situation, the voltage of the output terminal 136 of the latch circuit 130 and the voltage of the control terminal of the second switch 237 are equal to the input voltage of the power input Pin. Therefore, the second switch 237 is in an off state, and the switching voltage Vsw is equal to the input voltage of the power input Pin.

In one embodiment, the reference voltage Vref can be the ground voltage.

Since the first voltage divider resistor 243 and the second voltage divider resistor 244 of the output circuit 140 are serially connected between the input terminal 142 of the output circuit 140 and the reference voltage Vref, the voltage of the control terminal 144 of the output circuit 140 is the voltage division of the input voltage of the power input Pin. Therefore, in the first time slot T1, the voltage at the cathode of the diode 150 is equal to the input voltage of the power input Pin, and the voltage at the anode is equal to the voltage division of the input voltage of the power input Pin. In other words, in the first time slot T1, the diode 150 is in a reverse bias state.

Since the diode 150 is in the reverse bias state in the first time slot T1, the output circuit 140 will not receive the switching voltage Vsw in the first time slot T1. Therefore, the voltage at the second node N2 in the first time slot T1 is the voltage division of the input voltage of the power input Pin, which makes the control switch 242 be turned on. When the control switch 242 is turned on, the voltage of the control terminal of the output switch 241 becomes the reference voltage Vref, which turns on the output switch 241. As a result, as shown in FIG. 3D, the output circuit 140 outputs the power output Pout from its output terminal 146 in the first time slot T1.

In the second time slot T2, the input voltage of the power input Pin exceeds the threshold voltage, but the input current of the power input Pin does not exceed the threshold current. Under this situation, the shunt switch 214 of the current detection circuit 110 is in an off state, and the Zener diode 222 of the voltage detection circuit 120 is turned on due to reverse breakdown. Therefore, the voltage detection circuit 120 outputs the control voltage Vct, and the current detection circuit 110 does not output the control current Ict.

It is noted that the reference voltage Vref and the Zener voltage of the Zener diode 222 can be used to set the threshold voltage to determine the timing for the input protection circuit to provide the overvoltage protection function.

For example, in one embodiment, the Zener voltage of the Zener diode 222 is 20V and the reference voltage Vref is 0V. Under this situation, the threshold voltage of the input protection circuit 100 may be set to 20V. That is, the input protection circuit 100 provides the overvoltage protection function when the input voltage of the power input Pin exceeds 20V.

When the latch circuit 130 receives the control voltage Vct in the second time slot T2, as shown in FIG. 3B, the voltage of the first node N1 rises to turn on the first switch 236. Under this situation, the voltage of the output terminal 136 of the latch circuit 130 is equal to the reference voltage Vref, and the voltage of the control terminal of the second switch 237 drops. Therefore, the switching voltage Vsw is equal to the reference voltage Vref, and the second switch 237 is in an on state.

Since the switching voltage Vsw is equal to the reference voltage Vref in the second time slot T2, the diode 150 is in a forward bias state. Therefore, the switching voltage Vsw is transmitted to the second node N2 via the diode 150 to make the control switch 242 be in an off state. When the control switch 242 is turned off, the control terminal of the output switch 241 receives the input voltage of the power input Pin via the third voltage divider resistor 245. Therefore, the voltage of the control terminal of the output switch 241 rises, which makes the output switch be in an off state and the output circuit 140 stop to output the power output Pout.

From the above, since the input voltage of the power input Pin is higher than the threshold voltage in the second time slot T2, the input protection circuit 100 provides the overvoltage protection function.

It is noted that when the first switch 236 and the second switch 237 of the latch circuit 130 are both turned on, the first switch 236 and the second switch 237 form a latch-up structure. Therefore, as shown in FIG. 3A and FIG. 3D, once the input voltage of the power input Pin exceeds the threshold voltage, the switching voltage Vsw is maintained at the reference voltage Vref so that the output circuit 140 stops to output the power output Pout until the input voltage of the power input Pin drops to be lower than a disabling voltage to turn off the first switch 236.

In detail, in the third time slot T3, although the input voltage of the power input Pin drops from a voltage higher than the threshold voltage to a voltage lower than the threshold voltage, since the second switch 237 is still turned on, the voltage of the first node N1 still enough to turn on the first switch 236. Under this situation, the switching voltage Vsw is still maintained at the reference voltage Vref, so that the output switch 241 of the output circuit 140 is in an off state and the output circuit 140 stops to output the power output Pout.

In the fourth time slot T4, the input voltage of the power input Pin is dropped to be lower than the disabling voltage. Under this situation, the voltage of the first node N1 is dropped to be lower than the disabling voltage, which makes the first switch 236 be in an off state. Therefore, the first switch 236 and the second switch 237 no longer form the latch-up structure.

Therefore, when the input protection circuit 100 receives the power input Pin at the fifth time slot T5, the input protection circuit 100 performs the operations similar to those performed in the first time slot T1 to output the power output Pout.

From the above, when the input voltage of the power input Pin exceeds the threshold voltage, it is possible that the power circuit 103 is not compatible with the input protection circuit 100 and the backend circuit 101. The input protection circuit 100 can remind the user to replace the power circuit 103 with another suitable power circuit by not outputting the power output Pout.

Figure 4A:
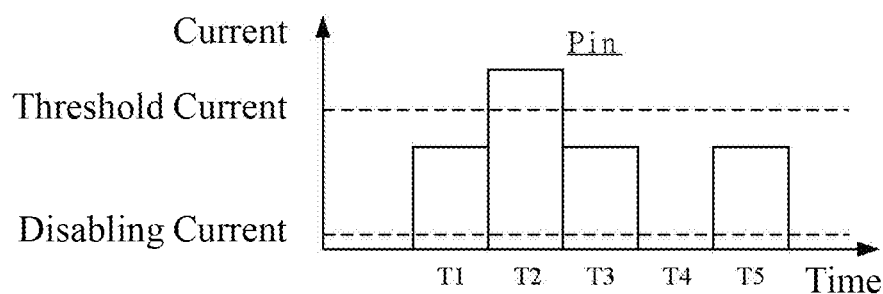
FIG. 4A shows the timing variations of an input current of the power input received by the input protection circuit.
Figure 4B:
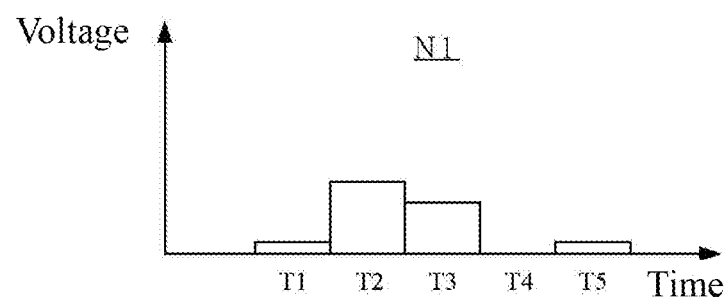
FIG. 4B shows the timing variations of the voltage of the first node of the latch circuit.
Figure 4C:
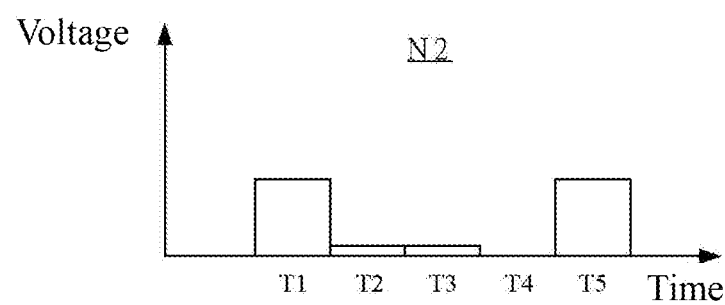
FIG. 4C shows the timing variations of the voltage of the second node of the output circuit.
Figure 4D:
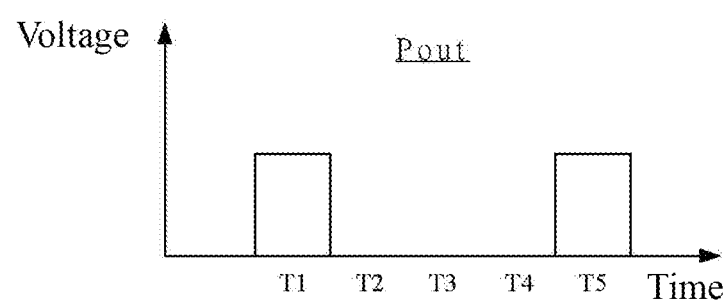
FIG. 4D shows the timing variations of the power output of the output circuit.

Please refer to FIGS. 4A-4D, in which FIG. 4A shows the timing variations of the input current of the power input Pin, FIG. 4B shows the timing variations of the voltage of the first node N1 of the latch circuit 130, FIG. 4C shows the timing variations of the voltage of the second node N2 of the output circuit 140, and FIG. 4D shows the timing variations of the power output Pout of the output circuit 140.

In the first time slot T1 shown in FIGS. 4A-4D, the input voltage of the power input Pin is lower than the threshold voltage, and the input current of the power input Pin is lower than the threshold current. The input protection circuit 100 performs the operations similar to those performed in the first time slot T1 of FIGS. 3A-3D, descriptions of which are omitted here for concise purpose.

In the second time slot T2 shown in FIGS. 4A-4D, the input voltage of the power input Pin is lower than the threshold voltage, but the input current of the power input Pin exceeds the threshold current. Under this situation, the voltage drop caused by the input current of the power input Pin between the two ends of the detection resistor 212 makes the voltage of the control terminal of the shunt switch 214 drop to a voltage that can turn on the shunt switch 214. On the other hand, the Zener diode 220 of the voltage detection circuit 120 is in the reverse bias state. Therefore, the current detection circuit 110 outputs the control current Ict, but the voltage detection circuit 110 does not output the control voltage Vct.

Practically, the resistances of the detection resistor 212 and the voltage-regulating resistor 216 can be adjusted to determine the magnitude of the threshold current (that is, to determine when the shunt switch 214 is turned on).

When the control current Ict flows through the control terminal 134 and the first resistor 231 of the latch circuit 130, the voltage of the control terminal 134 of the latch circuit 130 rises. When the voltage of the control terminal 134 of the latch circuit 130 rises, as shown in FIG. 4B, the voltage of the first node N1 rises to make the first switch 236 be turned on. Under this situation, the voltage of the output terminal 136 of the latch circuit 130 is equal to the reference voltage Vref, and the voltage of the control terminal of the second switch 237 drops. Therefore, the switching voltage Vsw is equal to the reference voltage Vref, and the second switch 237 is in an on state.

In other words, in the second time slot T2 shown in FIG. 4A-4D, the operations of the latch circuit 130, the output circuit 140 and the diode 150 are similar to those of the latch circuit 130, the output circuit 140 and the diode 150 in the second time slot shown in FIGS. 3A-3D to make the input protection circuit provide the overcurrent protection function. The relevant descriptions are omitted here for concise purpose.

It is noted that when the input current of the power input Pin exceeds the threshold current, the first switch 236 and the second switch 237 of the latch circuit 130 form the latch-up structure to make the input protection circuit 100 stop outputting the power output Pout until the input current of the power input Pin is lower than a disabling current to turn off the first switch 236.

Therefore, in the third time slot T3 shown in FIGS. 4A-4D, although the input current of the power input Pin drops from larger than the threshold current to smaller than the threshold current, the input protection circuit 100 still stops outputting the power output Pout.

In the fourth time slot T4 shown in FIGS. 4A-4D, the input current of the power input Pin drops to be smaller than the disabling current. Under this situation, the voltage of the first node N1 is dropped to a level sufficient to turn the first switch 236 off. Therefore, the first switch 236 and the second switch 237 no longer form the latch-up structure.

As a result, in the fifth time slot T5 shown in FIGS. 4A-4D, when the input protection circuit 100 receives the power input Pin, the input protection circuit 100 operates in a way similar to the operations in the first time slot T1 shown in FIGS. 4A-4D to output the power output Pout.

From the above, when the input current of the power input Pin exceeds the threshold current, it is possible that the power supply circuit 103 is not compatible with the input protection circuit 100 and the backend circuit 101. By not outputting the power output Pout, the input protection circuit 100 can remind the user to replace the power supply current 103 with other suitable power supply circuit.

Note that those shown in FIGS. 3A-3D and FIGS. 4A-4D are exemplary embodiments only without limiting the implementation of the present disclosure. For example, in one embodiment, when the input voltage of the power input Pin exceeds the threshold voltage and the input current of the power input Pin exceeds the threshold current, the latch circuit 130 makes the output circuit 140 stop outputting the power output Pout upon receiving the control voltage Vct and the control current Ict.

Figure 5:
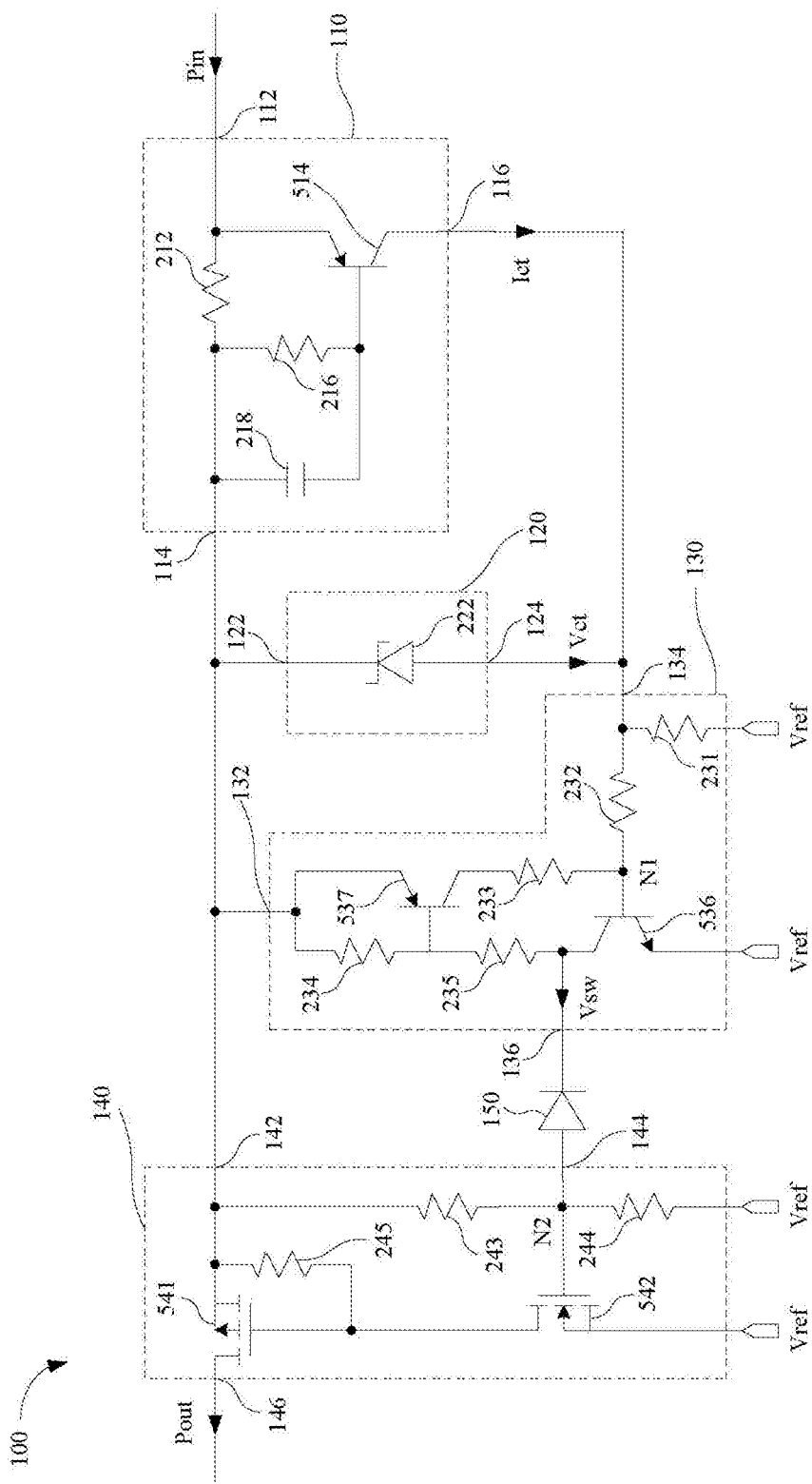
FIG. 5 is a schematic diagram of the circuit structure of the input protection circuit shown in FIG. 1 according to another embodiment.

FIG. 5 is a schematic diagram of the circuit structure of the input protection circuit 100 shown in FIG. 1 according to another embodiment. The embodiment shown in FIG. 5 is similar to the embodiment shown in FIG. 2, the difference is that in FIG. 5, a first PNP-type bipolar transistor 514, a second PNP-type bipolar transistor 537, a first NPN-type bipolar transistor 536, an N-type MOSFET 542 and a P-type MOSFET 541 are used to replace the shunt switch 214, the second switch 237, the first switch 236, the control switch 242 and the output switch 241 respectively.

The operations, connections and advantages of the functional blocks shown in FIG. 2 are also suitable for those shown in FIG. 5. Relevant descriptions are omitted here for concise purpose.

To sum up, the input protection circuit 100 realizes the overvoltage protection and the overcurrent protection functions with a simple circuit architecture without the need of outside control signals. Therefore, compared to the conventional overvoltage protection circuit or the overcurrent protection circuit, the input protection circuit 100 has the advantages of compact size and high application flexibility.

Some terms are used in the specification and claims to specify particular elements. However, persons having ordinary skill in the art would understand that the same elements may be referred to using different names. The elements are not distinguished by their names in the specification and the claims but by their functions. The term "comprising" in the specification and claims is an open-type terminology, which should be construed as "including but not limited to". Furthermore, the term "couple" should be construed to include any direct or indirect connection means. Therefore, in the disclosure to say a first element is coupled to a second element means the first element can be connected with the second element directly via a signal connection means such as an electrical connection, wireless connections or an optical connection, or indirectly via an electrical or signal connection means having another element.

Although the present disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the present disclosure.

What is claimed is:

1. An input protection circuit, comprising:
    a current detection circuit comprising a diode and configured to receive a power input, the power input comprising an input voltage and an input current, wherein when the input current exceeds a threshold current, the current detection circuit outputs a control current;
    a voltage detection circuit coupled to the current detection circuit, wherein when the input voltage exceeds a threshold voltage, the voltage detection circuit outputs a control voltage;
    a latch circuit coupled to an anode of the diode of the current detection circuit and the voltage detection circuit, wherein when the latch circuit receives the control voltage or the control current, a switching voltage outputted by the latch circuit is equal to a reference voltage; and
    an output circuit coupled to a cathode of the diode of the current detection circuit, the voltage detection circuit and the latch circuit, wherein when the switching voltage is equal to the reference voltage, the switching voltage is transmitted to the output circuit through the diode, and the output circuit stops outputting a power output.

2. The input protection circuit according to claim 1, wherein when the switching voltage is equal to the reference voltage, the latch circuit determines whether the input voltage is lower than a disabling voltage or whether the input current is lower than a disabling current, if yes, the switching voltage outputted by the latch circuit is not equal to the reference voltage, and the output circuit outputs the power output.

3. The input protection circuit according to claim 1, wherein the current detection circuit further comprises:
    an input terminal configured to receive the power input;
    a first output terminal configured to output the power input; and
    a second output terminal configured to output the control current.

4. The input protection circuit according to claim 3, wherein the voltage detection circuit further comprises:
    an input terminal coupled to the first output terminal of the current detection circuit and configured to receive the input voltage; and
    an output terminal configured to output the control voltage.

5. The input protection circuit according to claim 4, wherein the latch circuit further comprises:
    an input terminal coupled to the first output terminal of the current detection circuit;
    a control terminal coupled to the second output terminal of the current detection circuit and the output terminal of the voltage detection circuit and configured to receive the control voltage and the control current; and
    an output terminal coupled to the cathode of the diode and configured to output the switching voltage.

6. The input protection circuit according to claim 5, wherein the output circuit further comprises:
    an input terminal coupled to the first output terminal of the current detection circuit, the input terminal of the voltage detection circuit and the input terminal of the latch circuit and configured to receive the power input;
    a control terminal coupled to the anode of the diode and configured to receive the switching voltage; and
    an output terminal configured to output the power output.

7. The input protection circuit according to claim 6, wherein the current detection circuit further comprises:
    a detection resistor coupled between the input terminal and the first output terminal of the current detection circuit;
    a shunt switch coupled between the input terminal and the second output terminal of the current detection circuit;
    a voltage-regulating resistor coupled between the first output terminal of the current detection circuit and a control terminal of the shunt switch; and
    a voltage-regulating capacitor coupled between the first output terminal of the current detection circuit and the control terminal of the shunt switch,
    wherein when the input current exceeds the threshold current, the shunt switch is turned on to generate the control current.

8. The input protection circuit according to claim 6, wherein the voltage detection circuit further comprises:
    a Zener diode, comprising:
        a cathode coupled to the input terminal of the voltage detection circuit; and
        an anode coupled to the output terminal of the voltage detection circuit.

9. The input protection circuit according to claim 6, wherein the latch circuit further comprises:
    a first resistor comprising:
        a first terminal coupled to the control terminal of the latch circuit, and
        a second terminal coupled to a reference voltage;
    a second resistor comprising:
        a first terminal coupled to the control terminal of the latch circuit, and
        a second terminal;
    a first switch comprising:
        a first terminal coupled to the output terminal of the latch circuit,
        a control terminal coupled to the second terminal of the second resistor, and
        a second terminal coupled to the reference voltage;
    a second switch comprising:
        a first terminal coupled to the input terminal of the latch circuit,
        a control terminal, and
        a second terminal;
    a third resistor coupled between the second terminal of the second switch and the second terminal of the second resistor;
    a fourth resistor coupled between the input terminal of the latch circuit and the control terminal of the second switch; and a fifth resistor coupled between the control terminal of the second switch and the output terminal of the latch circuit.

10. The input protection circuit according to claim 6, wherein the output circuit further comprises:
an output switch coupled between the input terminal and the output terminal of the output circuit;
a control switch coupled between a control terminal of the output switch and a reference voltage, and a control terminal of the control switch is coupled to the control terminal of the output circuit;
a first voltage divider resistor coupled between the input terminal of the output circuit and the control terminal of the output circuit;
a second voltage divider resistor coupled between the control terminal of the output circuit and the reference voltage; and
a third voltage divider resistor coupled between the input terminal of the output circuit and the control terminal of the output switch,
wherein when the control terminal of the control switch receives the switching voltage, the control switch and the output switch are turned off.

* * * * *